US007198491B2

(12) United States Patent
Butler et al.

(10) Patent No.: US 7,198,491 B2
(45) Date of Patent: Apr. 3, 2007

(54) MULTI-PIN RF FIELD REPLACEABLE COAXIAL MOUNTING FLANGE STRUCTURE

(75) Inventors: Jeffrey T. Butler, Candor, NY (US); Brian M. Germano, Endicott, NY (US); Herbert M. Swan, III, Vestal, NY (US); Dale Zimmer, Apalachin, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 11/035,797

(22) Filed: Jan. 18, 2005

(65) Prior Publication Data

US 2006/0160378 A1 Jul. 20, 2006

(51) Int. Cl.
*H01R 12/00* (2006.01)
*H05K 1/00* (2006.01)

(52) U.S. Cl. ........................................ 439/63; 439/569

(58) Field of Classification Search .................. 439/63, 439/569

See application file for complete search history.

(56) References Cited

U.S. PATENT DOCUMENTS 3,114,887 A * 12/1963 Wedemeyer ................ 333/105
3,763,445 A * 10/1973 Hannaford et al. ......... 333/160
4,557,541 A 12/1985 Steuernagel et al.
4,695,811 A * 9/1987 Grellmann et al. ......... 333/105
4,813,886 A 3/1989 Roos et al.
4,900,258 A 2/1990 Hnatuck et al.
4,938,707 A 7/1990 Guimond et al.
4,962,447 A 10/1990 Ullman
5,909,155 A 6/1999 Anderson et al.
5,973,262 A 10/1999 Matubara
6,049,709 A 4/2000 Anderson et al.
6,050,850 A 4/2000 Crane, Jr. et al.
6,289,210 B1 9/2001 Anderson et al.
6,650,885 B2 11/2003 Anderson et al.
2006/0160378 A1* 7/2006 Butler et al. .................. 439/63

* cited by examiner

*Primary Examiner*—James R. Harvey
(74) *Attorney, Agent, or Firm*—Schwartz & Weinrieb

(57) ABSTRACT

A new and improved multi-pin RF field replaceable mounting flange structure, to be mounted upon a RF hybrid assembly, comprises a predetermined arrangement of multi-pin coaxial electrical connectors integrally incorporated upon a single field replaceable mounting flange structure for enabling the connection of a plurality of coaxial cables onto a single field replaceable mounting flange structure such that the plurality of coaxial cables can be electrically connected in a more spatially efficient manner than has been previously capable of being achieved regardless of the particular number of coaxial electrical connectors being connected.

24 Claims, 4 Drawing Sheets

MULTI-PIN RF FIELD REPLACEABLE COAXIAL MOUNTING FLANGE STRUCTURE

FIELD OF THE INVENTION

The present invention relates generally to electrical connector mounting flanges, electrical connector mounting flange systems, and RF hybrid assemblies having such electrical connector mounting flanges and electrical connector mounting flange systems mounted thereon, and more particularly to new and improved multi-pin RF field replaceable coaxial mounting flange structures to be mounted upon RF hybrid assemblies, wherein the new and improved multi-pin RF field replaceable coaxial mounting flange structures have different arrays or arrangements of multi-pin coaxial connectors integrally incorporated upon a single multi-pin RF field replaceable coaxial mounting flange structure for enabling the connection of a multiplicity of coaxial cables onto a single multi-pin RF field replaceable coaxial mounting flange structure such that the multiplicity of coaxial cables can be electrically connected to hermetically sealed field replaceable pins, which comprise glass seal structures which are electrically connected to various circuit devices or components internally embedded within the RF hybrid assemblies in a more spatially efficient manner than has been previously capable of being achieved by means of single-pin or standard RF field replaceable coaxial mounting flange structures, whereby more coaxial connections can be made within a predetermined hybrid package volume or hybrid housing. This is especially important within those environments, such as, for example, aircraft, satellites, and the like, wherein the amount of space that is available for accommodating electronic apparatus is always at a premium.

BACKGROUND OF THE INVENTION

RF hybrid assemblies comprise circuit devices or components, which are internally embedded within the RF hybrid assemblies, and hermetically sealed field replaceable pins which comprise glass seal structures which effectively define electrical connections or interfaces between the internally embedded circuit components or devices and external coaxial connectors under hermetically sealed conditions so as to prevent the internally embedded circuit components or devices from being exposed to any corrosive elements which may be present within the ambient environment. Coaxial cables are adapted to be connected to the coaxial connectors so as to effectively be electrically connected to the circuit components or devices internally embedded within the RF hybrid assemblies, however, when a multiplicity of coaxial cables are to be electrically connected to the RF hybrid assemblies in order to electrically connect such coaxial cables to the circuit components or devices internally embedded within the RF hybrid assemblies, each one of the coaxial cables is adapted to be connected to a respective one of the plurality of hermetically sealed field replaceable pins of the RF hybrid assemblies by means of coaxial connectors which are individually mounted upon single-pin or standard RF field replaceable coaxial mounting flange structures. More particularly, as can best be appreciated from FIG. 1, a conventional RF hybrid assembly is disclosed and is generally indicated by the reference character 10, and as can best be appreciated from FIG. 2, a plurality of circuit devices or components 12, only one of which is illustrated, are internally embedded within the RF hybrid assembly 10. A plurality of hermetically sealed field replaceable pins 14, 14 are mounted upon an external wall surface 16 of the RF hybrid assembly 10 and project or extend internally within the RF hybrid assembly 10 so as to be electrically connected to each one of the circuit devices or components 12. In this manner, the plurality of hermetically sealed field replaceable pins 14,14 effectively provide externally accessible electrical connections to the particular circuit device or component 12.

Continuing further, in order to in fact conventionally achieve electrical connections to each one of the circuit devices or components 12 internally embedded within the RF hybrid assembly 10, through means of respective ones of the plurality of hermetically sealed field replaceable pins 14,14, a suitable coaxial electrical connector 18, to which a coaxial cable, not shown, is to be connected, is integrally incorporated upon a separate standard field replaceable coaxial mounting flange structure 20. It is seen that each one of the standard field replaceable coaxial mounting flange structures 20 has a substantially elongated, elliptical or oval-shaped configuration, and that the coaxial electrical connector 18 is mounted upon the respective one of the standard field replaceable coaxial mounting flange structures 20 at a central region thereof. In addition, a pair of hexagonal-head threaded fasteners 22,22 are adapted to be inserted through opposite end portions of each one of the standard field replaceable coaxial mounting flange structures 20 so as to fixedly mount the standard field replaceable coaxial mounting flange structures 20 upon, for example, the external wall surface 16 of the RF hybrid assembly 10.

In this manner, it can be appreciated that each one of the standard field replaceable coaxial mounting flange structures 20 effectively defines a standard single-pin RF field replaceable coaxial mounting flange structure, and that once the electrical connections are in fact made between each one of the coaxial electrical connectors 18 and the corresponding one of the hermetically sealed field replaceable pins 14, the integrity of the electrical connection, defined between each coaxial cable, not shown, and the particular ones of the hermetically sealed field replaceable pins 14 of the circuit device or component 12, will be able to be preserved despite external forces which may be impressed upon the coaxial cables electrically connected to the coaxial electrical connectors 18. It is lastly noted, as can best be appreciated from FIG. 2, that the RF hybrid assembly 10 also has a mounting bracket 24 integrally formed upon a side wall portion 26 thereof whereby the RF hybrid assembly 10 can be fixedly secured upon a suitable support surface or within a suitable RF hybrid assembly housing, not shown, by means of an additional hexagonal-head fastener 26. Each one of the aforenoted standard single-pin RF field replaceable coaxial mounting flange structures 20 has of course been satisfactory from the viewpoint of reliably securing the coaxial cables and their respective coaxial electrical connectors 18 upon the RF hybrid assembly 10 such that the coaxial cables and their respective coaxial electrical connectors 18 can assuredly be connected to the hermetically sealed field replaceable pins 14 of the circuit device or component 12. It can readily be appreciated, however, that when each one of the standard single-pin field replaceable coaxial mounting flange structures 20 is mounted in its normal horizontal orientation upon one of the external wall surfaces 16 of the RF hybrid assembly 10 as illustrated within FIG. 1, each one of the standard single-pin field replaceable coaxial mounting flange structures 20 will exhibit a predetermined laterally or horizontally oriented width dimension.

More particularly, in view of the fact that each one of the coaxial electrical connectors 18 is disposed at the central region of each one of the standard single-pin field replaceable coaxial mounting flange structures 20, and correspondingly, in view of the additional fact that the pair of threaded fasteners 22,22 are disposed within the opposite end portions of each one of the standard single-pin field replaceable coaxial mounting flange structures 20, then it is readily apparent that each one of the coaxial electrical connectors 18 is disposed a significant or substantial distance from each oppositely disposed external end portion of its standard single-pin field replaceable coaxial mounting flange structure 20. Accordingly, when, for example, a pair of standard single-pin field replaceable coaxial mounting flange structures 20 are to be disposed in an adjacent, side-by-side, abutting array or arrangement so as to enable the coaxial cables and the coaxial connectors 18 of the pair of standard single-pin field replaceable coaxial mounting flange structures 20 to mate with the various hermetically sealed field replaceable pins 14 of different circuit devices or components 12, the minimum center-to-center distance defined between the pair of coaxial electrical connectors 18 is even more significant or substantial, or in other words, is, in fact, equal to twice the distance defined between one of the coaxial electrical connectors 18 and one of the oppositely disposed end portions of any one of the standard single-pin field replaceable coaxial mounting flange structures 20.

Therefore it is to be appreciated still further that such center-to-center distance defined between the pair of coaxial electrical connectors 18 disposed upon the pair of adjacent, side-by-side, and abutting standard single-pin field replaceable coaxial mounting flange structures 20 will necessarily dictate the minimum center-to-center distance that can be defined between the hermetically sealed field replaceable pins 14 of the various circuit devices or components 12. Viewed from a different perspective, the provision or disposition of the various circuit devices or components 12, and the provision or disposition of the hermetically sealed field replaceable pins 14 operatively associated therewith, internally within the RF hybrid assembly 10 must correspond to the disposition of the pair of coaxial electrical connectors 18 disposed upon the pair of adjacent, side-by-side, and abutting standard single-pin field replaceable coaxial mounting flange structures 20. Therefore, the provision or disposition of the various circuit devices or components 12, and the provision or disposition of the hermetically sealed field replaceable pins 14 operatively associated therewith, internally within the RF hybrid assembly 10 cannot be achieved in a relatively compact manner. Accordingly, the various RF hybrid assemblies 10 will necessarily exhibit predeterminedly large size, volume, and spatial parameters or characteristics whereby the location or accommodation of such RF hybrid assemblies 10 within predetermined spatial requirements or housings becomes problematic.

In an attempt to rectify the aforenoted spatial problems comprising the center-to-center distance defined between the pair of adjacent, side-by-side, and abutting standard single-pin field replaceable coaxial mounting flange structures 20, it has been proposed to mount the pair of adjacent, side-by-side, standard single-pin field replaceable coaxial mounting flange structures 20 at predetermined angles with respect to each other so as to effectively alter the resulting center-to-center distance defined between the pair of adjacent, side-by-side, standard single-pin field replaceable coaxial mounting flange structures 20, 20. As can readily be appreciated from FIGS. 2 and 3, the pair of adjacent, side-by-side, standard single-pin field replaceable coaxial mounting flange structures 20,20 may be disposed at an angle of, for example, 45° with respect to each other, either in an abutting or non-abutting relationship, such that the pair of coaxial electrical connectors 18,18, disposed upon the pair of adjacent, side-by-side, standard single-pin field replaceable coaxial mounting flange structures 20,20, will not only be disposed within the same horizontal plane so as to be capable of electrically mating with the pair of hermetically sealed field replaceable pins 14,14 of the RF hybrid assembly 10, but in addition, the center-to-center distance defined between the pair of coaxial electrical connectors 18,18 will be less than the center-to-center distance defined between the pair of coaxial electrical connectors 18,18 when the pair of adjacent, side-by-side, and abutting standard single-pin field replaceable coaxial mounting flange structures 20,20 are disposed in their horizontal orientation as disclosed within FIG. 1.

As a further alternative, the pair of adjacent, side-by-side, standard single-pin field replaceable coaxial mounting flange structures 20,20 may be disposed in a substantially vertical or 90° orientation with respect to each other, either in an abutting or non-abutting relationship, whereby, again, not only will the coaxial electrical connectors 18,18 of the pair of adjacent, side-by-side, standard single-pin field replaceable coaxial mounting flange structures 20,20 be disposed within the same horizontal plane so as to be capable of electrically mating with the pair of hermetic-ally sealed field replaceable pins 14,14 of the RF hybrid assembly 10, but in addition, the center-to-center distance defined between the pair of coaxial electrical connectors 18,18 will be less than the center-to-center distance defined between the pair of coaxial electrical connectors 18,18 when the pair of adjacent, side-by-side, and abutting standard single-pin field replaceable coaxial mounting flange structures 20,20 are disposed in their horizontal orientation as disclosed within FIG. 1. While the aforenoted 45° angularly oriented, or 90° vertically oriented, arrangements or dispositions of the pair of adjacent, side-by-side, and abutting standard single-pin field replaceable coaxial mounting flange structures 20,20, as disclosed within FIGS. 2 and 3, effectively resolve the problem concerning the center-to-center distance defined between the pair of coaxial electrical connectors 18,18 when the pair of adjacent, side-by-side, and abutting standard single-pin field replaceable coaxial mounting flange structures 20,20 are disposed in their horizontal orientation as disclosed within FIG. 1, the disposition of the pair of adjacent, side-by-side, standard single-pin field replaceable coaxial mounting flange structures 20,20 at their relative 45° angular orientation, such as, for example, as illustrated within FIGS. 2 and 3, or within their vertical or 90° orientation, not illustrated, presents an additional problem.

More particularly, it can readily be appreciated that when the pair of adjacent, side-by-side, standard single-pin field replaceable coaxial mounting flange structures 20,20 are disposed in either one of their 45° angular, or 90° vertical, orientations, the relative height dimension or depth profile, as defined between the oppositely disposed end portions of each one of the pair of adjacent, side-by-side, standard single-pin field replaceable coaxial mounting flange structures 20,20, within which the bolt fasteners 22, 22 are disposed, is substantially increased as compared to the relative height dimension or depth profile characteristic of any one of the standard single-pin field replaceable coaxial mounting flange structures 20, as defined between the upper and lower edge portions of the standard single-pin field replaceable coaxial mounting flange structures 20, when the standard single-pin field replaceable coaxial mounting flange structures 20 are disposed in their horizontal mode as illustrated within FIG. 1. Accordingly, again, the various RF hybrid assemblies 10 will necessarily exhibit predeterminedly large size, volume, and spatial parameters or characteristics when such 45° angularly oriented, or 90° vertically oriented, standard single-pin field replaceable coaxial mounting flange structures 20,20 are mounted thereon, whereby the location or accommodation of such RF hybrid assemblies 10 within predetermined spatial requirements or housings still remains problematic.

A need therefore exists in the art for a new and improved RF field replaceable mounting flange structure wherein not only can the center-to-center distance defined between adjacent coaxial electrical connectors effectively be minimized, but in addition, the overall height dimension or depth profile of the RF hybrid assembly can likewise be maintained as small as possible so as to permit such RF hybrid assemblies to be readily and easily accommodated within predetermined spatial requirements or housings as may be necessary, such as, for example, aircraft, satellites, and the like, wherein the amount of space that is available for accommodating electronic apparatus is always at a premium.

SUMMARY OF THE INVENTION

The foregoing and other objectives are achieved in accordance with the teachings and principles of the present invention through the provision of a new and improved multi-pin RF field replaceable coaxial mounting flange structure, to be mounted upon an RF hybrid assembly, wherein the new and improved multi-pin RF field replaceable coaxial mounting flange structure can have a predetermined array or arrangement of multi-pin coaxial connectors integrally incorporated upon a single field replaceable coaxial mounting flange structure for enabling the connection of a multiplicity of coaxial cables onto a single field replaceable coaxial mounting flange structure such that the multiplicity of coaxial cables can, in turn, be electrically connected to hermetically sealed field replaceable pins, which comprise glass seal structures which are electrically connected to various circuit devices or components internally embedded within the RF hybrid assemblies, in a more spatially efficient manner than has been previously capable of being achieved by means of multiple single-pin or standard RF field replaceable coaxial mounting flange structures. The predetermined arrays or arrangements of the multi-pin coaxial connectors integrally incorporated upon the single multi-pin field replaceable coaxial mounting flange structures can be varied so as to effectively be tailored to different connection requirements characteristic of the particular circuit devices or components internally embedded within the particular RF hybrid assembly, and in this manner, the provision of the new and improved multi-pin RF field replaceable coaxial mounting flange structures enable or facilitate more coaxial connections to be more efficiently or compactly made within a predetermined hybrid package volume or hybrid housing. This is especially important within those environments, such as, for example, aircraft, satellites, and the like, wherein the amount of space that is available for accommodating electronic apparatus is always at a premium.

BRIEF DESCRIPTION OF THE DRAWINGS

Various other objects, features, and attendant advantages of the present invention will be more fully appreciated from the following detailed description when considered in connection with the accompanying drawings in which like reference characters designate like or corresponding parts throughout the several views, and wherein.

DETAILED DESCRIPTION OF THE ILLUSTRATED EMBODIMENTS

Figure 1:
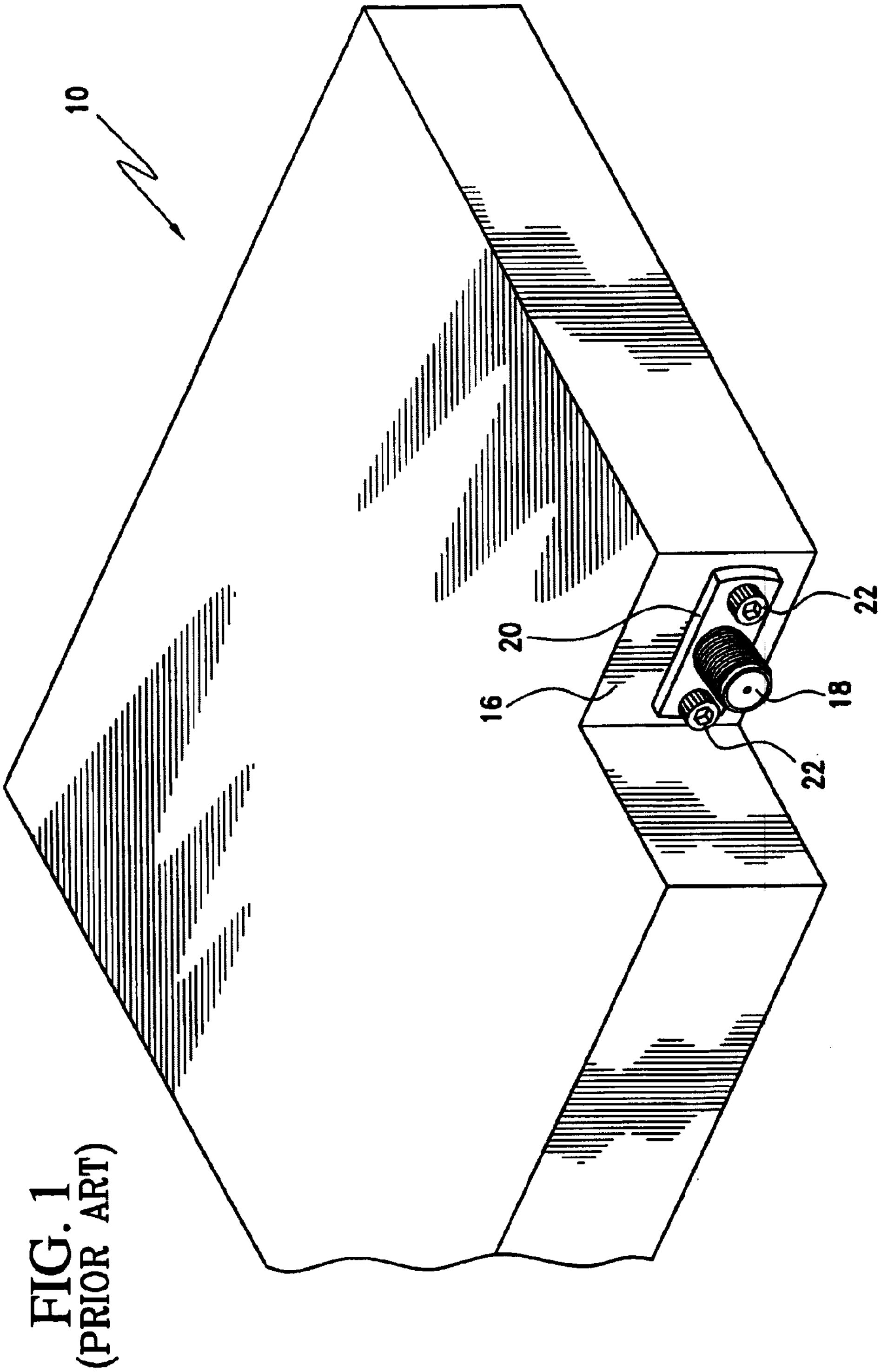
FIG. 1 (PRIOR ART)
FIG. 1 is a perspective view of an RF hybrid assembly having a conventional, Prior Art standard single-pin field replaceable coaxial flange structure mounted thereon.
Figure 3:
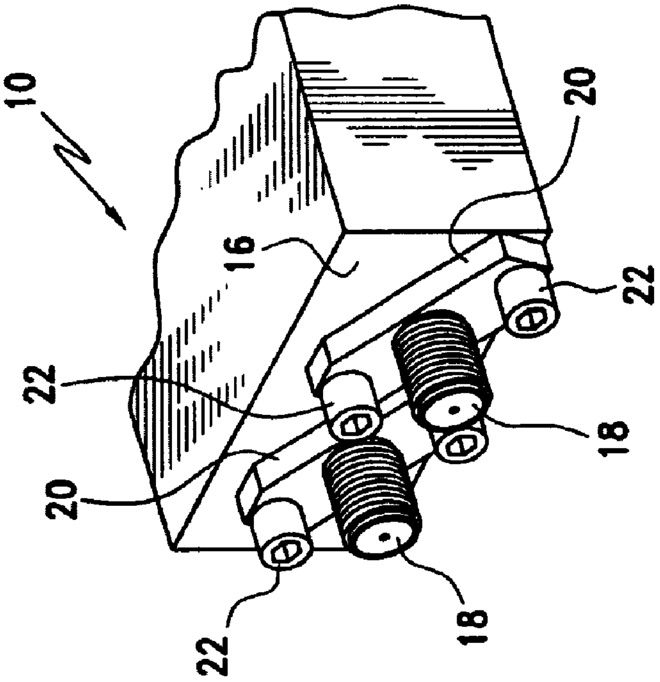
FIG. 3 (PRIOR ART)
FIG. 3 is a perspective view of an RF hybrid assembly, corresponding to the RF hybrid assembly as illustrated within FIG. 2, showing the mounting of multiple standard single-pin field replaceable coaxial flange structures upon the RF hybrid assembly at a 45° angular disposition whereby the height dimension or depth profile of the RF hybrid assembly will accordingly be enlarged as compared to the RF hybrid assembly as disclosed within FIG. 1.
Figure 2:
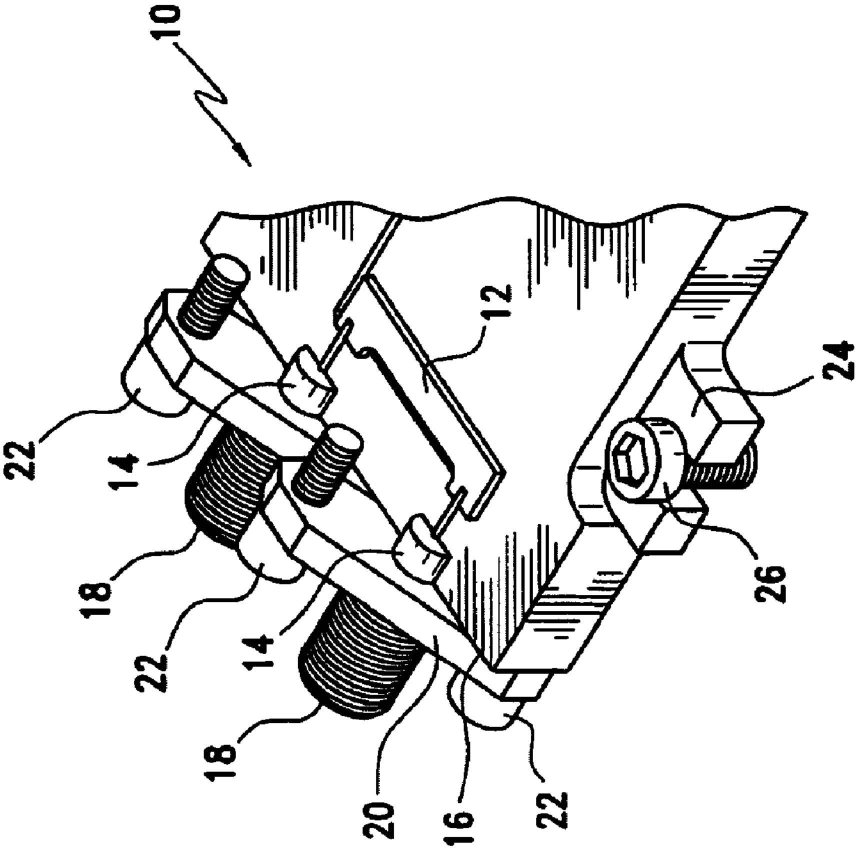
FIG. 2 (PRIOR ART)
FIG. 2 is a horizontal cross-sectional, perspective view of an RF hybrid assembly, similar to the RF hybrid assembly as illustrated within FIG. 1, showing the internal disposition of a circuit device or component, the hermetically sealed field replaceable pins electrically connected to the circuit device or component, and the mounting of multiple standard single-pin field replaceable coaxial flange structures upon the RF hybrid assembly at a 45° angular disposition.
Figure 4:
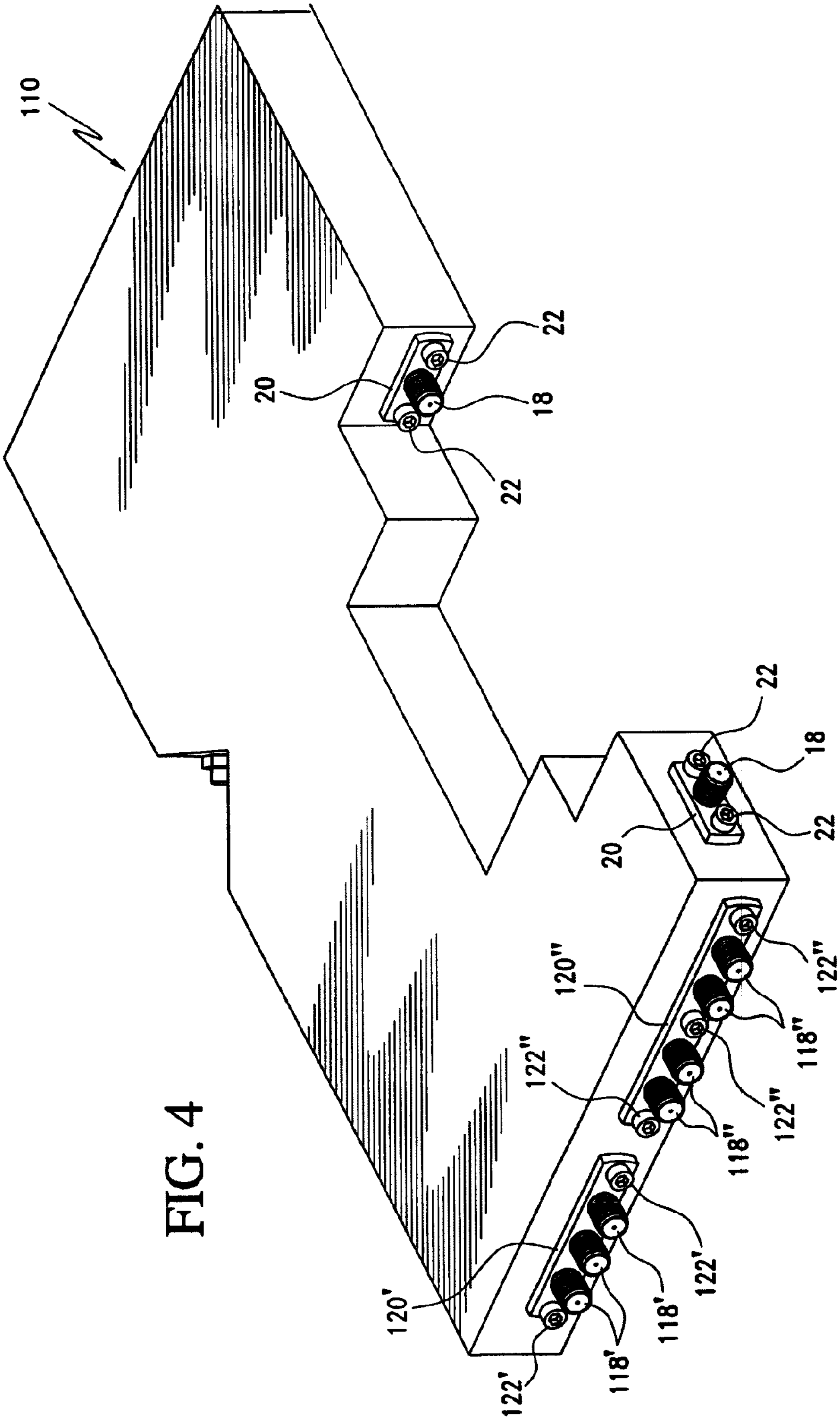
FIG. 4 is a perspective view, similar to that of FIG. 1, showing, however, an RF hybrid assembly having new and improved multi-pin RF field replaceable coaxial mounting flange structures, constructed in accordance with the principles and teachings of the present invention, mounted thereon, wherein the multi-pin RF field replaceable coaxial mounting flange structures are seen to have different arrays or arrangements of coaxial electrical connectors mounted thereon, which are tailored to the different connection requirements characteristic of the particular circuit devices or components internally embedded within the RF hybrid assembly, such that compact arrangements of the coaxial electrical connectors can be achieved and yet the height dimension or depth profile of the RF hybrid assembly can be preserved so as to effectively match that of a conventional RF hybrid assembly.
Figure 5:
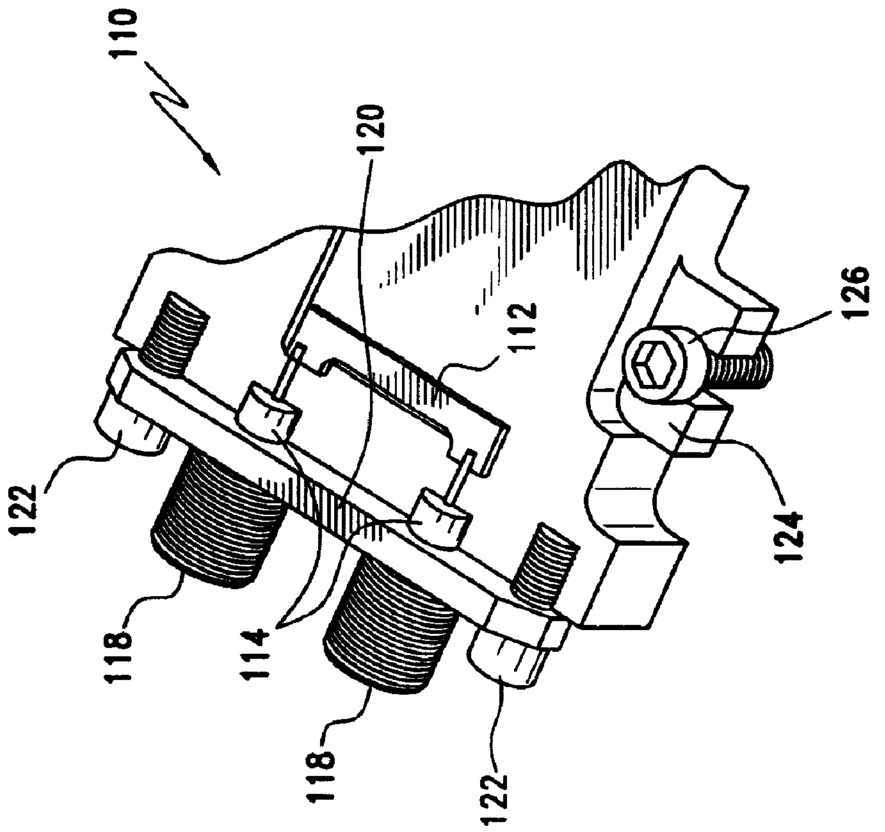
FIG. 5 is a horizontal cross-sectional, perspective view, similar to that of FIG. 2, showing, however, an RF hybrid assembly, similar to the RF hybrid assembly as illustrated within FIG. 4, comprising the internal disposition of a circuit device or component, the hermetically sealed field replaceable pins electrically connected to the circuit device or component, and the mounting of one of the multi-pin RF field replaceable coaxial mounting flange structures, constructed in accordance with the principles and teachings of the present invention and as disclosed within FIG. 4, upon the RF hybrid assembly.
Figure 6:
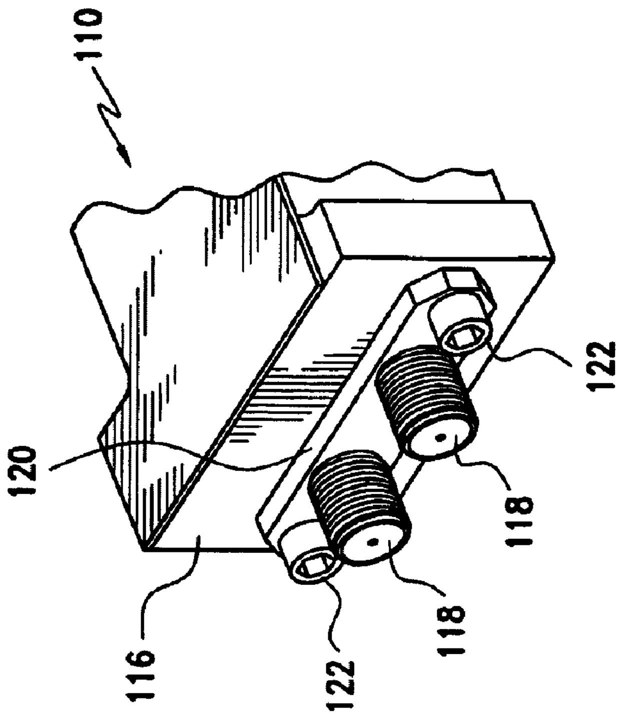
FIG. 6 is a perspective view, similar to that of FIG. 3, showing, however, a RF hybrid assembly corresponding to the RF hybrid assembly as shown within FIG. 5, illustrating the mounting of one of the multi-pin RF field replaceable coaxial mounting flange structures upon the RF hybrid assembly whereby a compact arrangement of the coaxial electrical connectors is able to be achieved, and yet the height dimension or depth profile of the RF hybrid assembly can be maintained at a size which is similar to that of a conventional RF hybrid assembly having conventional, Prior Art standard single-pin field replaceable coaxial mounting flange structures mounted thereon.

Referring now to the drawings, and more particularly to FIG. 4–6 thereof, a new and improved RF hybrid assembly, constructed in accordance with the principles and teachings of the present invention, is disclosed and is generally indicated by the reference character 110. It will be initially appreciated that the various components comprising the new and improved RF hybrid assembly 110, and which correspond to the various components comprising the conventional RF hybrid assembly 10, as disclosed within FIGS. 1–3, will be designated by corresponding reference numerals except that the reference numerals will be within the 100 series. More particularly, as can best be appreciated from FIG. 5, a plurality of circuit devices or components 112, only one of which is illustrated, are internally embedded within the RF hybrid assembly 110, and a plurality of hermetically sealed field replaceable pins 114,114 are mounted upon an external wall surface 116 of the RF hybrid assembly 110 so as to project or extend internally within the RF hybrid assembly 110 and thereby be electrically connected to each one of the circuit devices or components 112. In this manner, the plurality of hermetically sealed field replaceable pins 114,114 effectively provide externally accessible electrical connections to the particular circuit device or component 112.

Continuing further, as was the case with the conventional RF hybrid assembly 10, in order to in fact achieve electrical connections to the circuit devices or components 112 internally embedded within the RF hybrid assembly 110, through means of the plurality of hermetically sealed field replaceable pins 114,114, suitable coaxial electrical connectors 118,118, to which coaxial cables, not shown, are to be connected, are provided, however, unlike the standard single-pin field replaceable coaxial mounting flange structure 20 upon which a single coaxial electrical connector 18 is integrally incorporated, it is seen that in accordance with the principles and teachings of the present invention, a plurality of coaxial electrical connectors 118,118 are integrally incorporated upon a single multi-pin RF field replaceable coaxial mounting flange structure 120. More particularly, in accordance with a first embodiment of a single multi-pin RF field replaceable coaxial mounting flange structure 120, constructed in accordance with the principles and teachings of the present invention, and as disclosed within FIGS. 5 and 6, it is seen that the single multi-pin RF field replaceable coaxial mounting flange structure 120 is similar to either one of the standard single-pin field replaceable coaxial mounting flange structures 20,20 as disclosed within FIGS. 1–3 in that the same has a substantially elongated, elliptical or oval-shaped configuration wherein a pair of threaded fasteners 122,122 are adapted to be inserted through the opposite end portions of the single multi-pin RF field replaceable coaxial mounting flange structure 120 so as to fixedly mount the single multi-pin RF field replaceable coaxial mounting flange structure 120 upon, for example, an external wall surface 116 of the RF hybrid assembly 110.

However, it is additionally seen that at least one pair of the coaxial electrical connectors 118,118 are mounted upon the single multi-pin RF field replaceable coaxial mounting flange structure 120 so as to be located adjacent to each other without one of the threaded fasteners 122,122 being interposed between the pair of coaxial electrical connectors 118,118. In this manner, viewed from a converse or opposite point of view, since a threaded fastener 122 is not necessarily disposed upon both opposite sides of each one of the coaxial electrical connectors 118,118, the pair of coaxial electrical connectors 118,118 can be disposed at any one of a multitude of locations which are separated predetermined distances from each other as may be dictated, for example, by means of the spacing defined between the plurality of hermetically sealed field replaceable pins 114,114 which are electrically connected to the circuit devices or components 112 internally embedded within the RF hybrid assembly 110. The disposition of the plurality of coaxial electrical connectors 118,118 upon the single multi-pin RF field replaceable coaxial mounting flange structure 120 may therefore be tailored accordingly and may in fact be minimized with the pair of coaxial electrical connectors 118,118 disposed in abutting contact with each other.

Alternatively, as can best be seen from FIG. 4, other embodiments, comprising different or various arrays or arrangements of the plurality of coaxial electrical connectors 118 upon single multi-pin RF field replaceable coaxial mounting flange structures, may be formulated as desired. For example, it is seen that in accordance with additional teachings and principles of the present invention, a second embodiment of a single multi-pin RF field replaceable coaxial mounting flange structure 120' may comprise three coaxial electrical connectors 118',118',118' disposed in a linear array upon the single multi-pin RF field replaceable coaxial mounting flange structure 120' such that the three coaxial electrical connectors 118',118',118' are disposed immediately adjacent to each other without any one of the threaded fasteners 122' being interposed between any one pair of the three coaxial electrical connectors 118',118',118'. More particularly, the pair of threaded fasteners 122',122' are mounted within the oppositely disposed, laterally spaced end portions of the single multi-pin RF field replaceable coaxial mounting flange structure 120'. Alternatively, still further, a third embodiment of a single RF field replaceable mounting flange structure 120" may comprise four coaxial electrical connectors 118",118",118",118" which are disposed within a linear array upon the single multi-pin RF field replaceable coaxial mounting flange structure 120" such that the four coaxial electrical connectors 118",118",118",118" are disposed in two pairs of two coaxial electrical connectors 118",118"and 118",118".

Each pair of the four coaxial electrical connectors 118", 118",118",118" comprises two coaxial electrical connectors 118",118" disposed immediately adjacent to each other without any one of the threaded fasteners 122" being interposed between the two coaxial electrical connectors 118", 118" comprising either one of the pairs of the coaxial electrical connectors 118",118",118",118", and it is seen that a pair of threaded fasteners 122", 122" are mounted within the oppositely disposed, laterally spaced end portions of the single multi-pin RF field replaceable coaxial mounting flange structure 120", while a third threaded fastener 122" is mounted within a central region of the single multi-pin RF field replaceable coaxial mounting flange structure 120" so as to be interposed between the two pairs of the coaxial electrical connectors 118",118" and 118", 118". It may therefore be appreciated once again that the various coaxial electrical connectors 118,118',118" may be arranged upon the various single multi-pin RF field replaceable coaxial mounting flange structures 120,120',120" in accordance with different arrays or arrangements so as to space the various coaxial electrical connectors 118,118', 118" with respect to each other in accordance with predetermined dimensions corresponding to the disposition or configurations comprising the hermetically sealed field replaceable pins 114,114 and the circuit devices or components 112.

Thus, it may be seen that in accordance with the principles and teachings of the present invention, there has been disclosed a new and improved multi-pin RF field replaceable coaxial mounting flange structure, to be mounted upon an RF hybrid assembly, wherein the new and improved multi-pin RF field replaceable coaxial mounting flange structure comprises a predetermined array or arrangement of multi-pin coaxial electrical connectors integrally incorporated upon a single multi-pin field replaceable coaxial mounting flange structure for enabling the connection of a multiplicity of coaxial cables onto a single multi-pin field replaceable coaxial mounting flange structure such that the multiplicity of coaxial cables can, in turn, be electrically connected to hermetically sealed field replaceable pins, which comprise glass seal structures which are electrically connected to various circuit devices or components internally embedded within the RF hybrid assemblies, in a more spatially efficient manner than has been previously capable of being achieved by means of multiple standard single-pin RF field replaceable coaxial mounting flange structures. The predetermined arrays or arrangements of the multi-pin coaxial electrical connectors integrally incorporated upon the single multi-pin field replaceable coaxial mounting flange structures can be varied so as to effectively be tailored to different connection requirements characteristic of the particular circuit devices or components internally embedded within the particular RF hybrid assembly, and in this manner, the provision of the new and improved multi-pin RF field replaceable coaxial mounting flange structures enable or facilitate more coaxial connections to be made within a predetermined hybrid package volume or hybrid housing. This is especially important within those environments, such as, for example, aircraft, satellites, and the like, wherein the amount of space that is available for accommodating electronic apparatus is always at a premium.

Lastly, it is noted that, in light of the foregoing disclosure, many variations and modifications of the present invention are possible. For example, while particular arrays or arrangements of the various coaxial electrical connectors 118,118',118" have been illustrated upon the various single multi-pin RF field replaceable coaxial mounting flange structures 120,120',120", other arrays or arrangements of similar coaxial electrical connectors upon similar single multi-pin RF field replaceable coaxial mounting flange structures may of course be constructed in accordance with the principles and teachings of the present invention. It is therefore to be understood that within the scope of the appended claims, the present invention may be practiced otherwise than as specifically described herein.

What is claimed as new and desired to be protected by: Letters Patent of the United States of America, is:

1. A multi-pin RF field replaceable coaxial mounting flange system, adapted to be mounted upon an RF hybrid assembly so as to electrically connect a plurality of coaxial electrical connectors to hermetically sealed field replaceable pins mounted upon the RF hybrid assembly and electrically connected to circuit components of the RF hybrid assembly, comprising:

a single multi-pin RF field replaceable coaxial mounting flange structure;

fastener means for fixedly securing said multi-pin RF field replaceable coaxial mounting flange structure upon the RF hybrid assembly; and a plurality of coaxial electrical connectors mounted upon said single multi-pin RF field replaceable coaxial mounting flange structure in a side-by-side arrangement such that said plurality of coaxial electrical connectors are disposed adjacent to each other upon said single multi-pin RF field replaceable coaxial mounting flange structure;

wherein, regardless of the particular number of coaxial electrical connectors comprising said plurality of coaxial electrical connectors, said fastener means are always disposed upon opposite ends of said side-by-side arrangement of said plurality of coaxial electrical connectors at positions immediately adjacent to those coaxial electrical connectors, of said plurality of coaxial electrical connectors, which define end ones of said plurality of coaxial electrical connectors comprising said side-by-side arrangement of said plurality of coaxial electrical connectors, and wherein further, regardless of the particular number of coaxial electrical connectors comprising said plurality of coaxial electrical connectors, opposite terminal ends of said single multi-pin RF field replaceable coaxial mounting flange structure are always disposed immediately adjacent to said coaxial electrical connectors which define said end ones of said plurality of coaxial electrical connectors comprising said side-by-side arrangement of said plurality of coaxial electrical connectors such that the entire size and extent of said multi-pin RF field replaceable coaxial mounting flange system can be predeterminedly minimized so as to effectively maximize the spatial compactness of said plurality of coaxial electrical connectors as mounted upon said single multi-pin RF field replaceable coaxial mounting flange structure in order to, in turn, maximize the number of coaxial electrical connections of said plurality of coaxial electrical connectors to the hermetically sealed field replaceable pins and the circuit components of the RF hybrid assembly.

2. The multi-pin RF field replaceable coaxial mounting flange system as set forth in claim 1, wherein:

said plurality of coaxial electrical connectors mounted upon said single multi-pin RF field replaceable coaxial mounting flange structure comprises a pair of coaxial electrical connectors mounted upon a central region of said single multi-pin RF field replaceable coaxial mounting flange structure; and said fastener means comprises, a pair of fasteners mounted upon opposite, laterally spaced end portions of said single multi-pin RF field replaceable coaxial mounting flange structure.

3. The multi-pin RF field replaceable coaxial mounting flange system as set forth in claim 2, wherein:

said pair of coaxial electrical connectors and said pair of fasteners are disposed within a linear array so as to minimize the height dimension and depth profile of said multi-pin RF field replaceable coaxial mounting flange system.

4. The multi-pin RF field replaceable coaxial mounting flange system as set forth in claim 1, wherein:

said plurality of coaxial electrical connectors mounted upon said single multi-pin RF field replaceable coaxial mounting flange structure comprises three coaxial electrical connectors mounted upon a central region of said single multi-pin RF field replaceable coaxial mounting flange structure; and said fastener means comprises a pair of fasteners mounted upon opposite, laterally spaced end portions of said single multi-pin RF field replaceable coaxial mounting flange structure.

5. The multi-pin RF field replaceable coaxial mounting flange system as set forth in claim 4, wherein:

said three coaxial electrical connectors and said pair of fasteners are disposed within a linear array so as to minimize the height dimension and depth profile of said multi-pin RF field replaceable coaxial mounting flange system.

6. The multi-pin RF field replaceable coaxial mounting flange system as set forth in claim 1, wherein:

said plurality of coaxial electrical connectors mounted upon said single multi-pin RF field replaceable coaxial mounting flange structure comprises four coaxial electrical connectors mounted upon a central region of said single multi-pin RF field replaceable coaxial mounting flange structure; and said fastener means comprises a pair of fasteners mounted upon opposite, laterally spaced end portions of said single multi-pin RF field replaceable coaxial mounting flange structure.

7. The multi-pin RF field replaceable coaxial mounting flange system as set forth in claim 6, wherein:

said four coaxial electrical connectors are divided into first and second pairs of coaxial electrical connectors laterally spaced from each other; and said fastener means comprises a third fastener interposed between said first and second pairs of coaxial electrical connectors.

8. The multi-pin RF field replaceable coaxial mounting flange system as set forth in claim 7, wherein:

said four coaxial electrical connectors and said three fasteners are disposed within a linear array so as to minimize the height dimension and depth profile of said multi-pin RF field replaceable coaxial mounting flange system.

9. A multi-pin RF field replaceable coaxial mounting flange system, adapted to be mounted upon an RF hybrid assembly so as to electrically connect a plurality of coaxial electrical connectors to hermetically sealed field replaceable pins mounted upon the RF hybrid assembly and electrically connected to circuit components of the RF hybrid assembly, comprising:

a single multi-pin RF field replaceable coaxial mounting flange structure;

fastener means for fixedly securing said multi-pin RF field replaceable coaxial mounting flange structure upon the RF hybrid assembly; and a plurality of coaxial electrical connectors mounted upon said single multi-pin RF field replaceable coaxial mounting flange structure within any one of a plurality of different arrays which respectively comprise side-by-side arrangements such that said plurality of coaxial electrical connectors, disposed within each one of said different arrays, are disposed adjacent to each other upon said single multi-pin RF field replaceable coaxial mounting flange structure;

wherein, regardless of the particular number of coaxial electrical connectors comprising said plurality of coaxial electrical connectors, said fastener means are always disposed upon opposite ends of each one of said side-by-side arrangements of said plurality of coaxial electrical connectors at positions immediately adjacent to those coaxial electrical connectors, of said plurality of coaxial electrical connectors, which define end ones of said plurality of coaxial electrical connectors comprising said side-by-side arrangements of said plurality of coaxial electrical connectors, and wherein further, regardless of the particular number of coaxial electrical connectors comprising said plurality of coaxial electrical connectors, opposite terminal ends of said single multi-pin RF field replaceable coaxial mounting flange structure are always disposed immediately adjacent to said coaxial electrical connectors which define said end ones of said plurality of coaxial electrical connectors comprising each one of said side-by-side arrangements of said plurality of coaxial electrical connectors such that the entire size and extent of said multi-pin RF field replaceable coaxial mounting flange system can be predeterminedly minimized so as to effectively maximize the spatial compactness of said plurality of coaxial electrical connectors as mounted upon said single multi-pin RF field replaceable coaxial mounting flange structure in order to, in turn, maximize the number of coaxial electrical connections of said plurality of coaxial electrical connectors to the hermetically sealed field replaceable pins and the circuit components of the RF hybrid assembly.

10. The multi-pin RF field replaceable coaxial mounting flange system as set forth in claim 9, wherein:

one of said different arrays of said plurality of coaxial electrical connectors mounted upon said single multi-pin RF field replaceable coaxial mounting flange structure comprises a pair of coaxial electrical connectors mounted upon a central region of said single multi-pin RF field replaceable coaxial mounting flange structure; and said fastener means comprises a pair of fasteners mounted upon opposite, laterally spaced end portions of said single multi-pin RF field replaceable coaxial mounting flange structure.

11. The multi-pin RF field replaceable coaxial mounting flange system as set forth in claim 10, wherein:

said pair of coaxial electrical connectors and said pair of fasteners are disposed within a linear array so as to minimize the height dimension and depth profile of said multi-pin RF field replaceable coaxial mounting flange system.

12. The multi-pin RF field replaceable coaxial mounting flange system as set forth in claim 9, wherein:

one of said different arrays of said coaxial electrical connectors mounted upon said single multi-pin RF field replaceable coaxial mounting flange structure comprises three coaxial electrical connectors mounted upon a central region of said single multi-pin RF field replaceable coaxial mounting flange structure; and said fastener means comprises a pair of fasteners mounted upon opposite, laterally spaced end portions of said single multi-pin RF field replaceable coaxial mounting flange structure.

13. The multi-pin RF field replaceable coaxial mounting flange system as set forth in claim 12, wherein:

said three coaxial electrical connectors and said pair of fasteners are disposed within a linear array so as to minimize the height dimension and depth profile of said multi-pin RF field replaceable coaxial mounting flange system.

14. The multi-pin RF field replaceable coaxial mounting flange system as set forth in claim 9, wherein:

one of said different arrays of said coaxial electrical connectors mounted upon said single multi-pin RF field replaceable coaxial mounting flange structure comprises four coaxial electrical connectors mounted upon a central region of said single multi-pin RF field replaceable coaxial mounting flange structure; and said fastener means comprises a pair of fasteners mounted upon opposites laterally spaced end portions of said single multi-pin RF field replaceable coaxial mounting flange structure.

15. The multi-pin RF field replaceable coaxial mounting flange system as set forth in claim 14, wherein:

said four coaxial electrical connectors are divided into first and second pairs of coaxial electrical connectors laterally spaced from each other; and said fastener means comprises a third fastener interposed between said first and second pairs of coaxial electrical connectors.

16. The multi-pin RF field replaceable coaxial mounting flange system as set forth in claim 15, wherein:

said four coaxial electrical connectors and said three fasteners are disposed within a linear array so as to minimize the height dimension and depth profile of said multi-pin RF field replaceable coaxial mounting flange system.

17. In combination, a multi-pin RF field replaceable coaxial mounting flange system and an RF hybrid assembly, comprising:

an RF hybrid assembly comprising at least one circuit component and a plurality of hermetically sealed field replaceable pins electrically connected to said at least one circuit component of said RF hybrid assembly; and a multi-pin RF field replaceable coaxial mounting flange system for electrically connecting a plurality of coaxial electrical connectors to said hermetically sealed field replaceable pins mounted upon said RF hybrid assembly;

said multi-pin RF field replaceable coaxial mounting flange system comprising a single multi-pin RF field replaceable coaxial mounting flange structure; fastener means for fixedly securing said multi-pin RF field replaceable coaxial mounting flange structure upon the RF hybrid assembly; and a plurality of coaxial electrical connectors mounted upon said single multi-pin RF field replaceable coaxial mounting flange structure in a side-by-side arrangement such that said plurality of coaxial electrical connectors are disposed adjacent to each other upon said single multi-pin RF field replaceable coaxial mounting flange structure;

wherein, regardless of the particular number of coaxial electrical connectors comprising said plurality of coaxial electrical connectors, said fastener means are always disposed upon opposite ends of said side-by-side arrangement of said plurality of coaxial electrical connectors at positions immediately adjacent to those coaxial electrical connectors, of said plurality of coaxial electrical connectors, which define end ones of said plurality of coaxial electrical connectors comprising said side-by-side arrangement of said plurality of coaxial electrical connectors, and wherein further, regardless of the particular number of coaxial electrical connectors comprising said plurality of coaxial electrical connectors, opposite terminal ends of said single multi-pin RF field replaceable coaxial mounting flange structure are always disposed immediately adjacent to said coaxial electrical connectors which define said end ones of said plurality of coaxial electrical connectors comprising said side-by-side arrangement of said plurality of coaxial electrical connectors such that the entire size and extent of said multi-pin RF field replaceable coaxial mounting flange system can be predeterminedly minimized so as to effectively maximize the spatial compactness of said plurality of coaxial electrical connectors as mounted upon said single multi-pin RF field replaceable coaxial mounting flange structure in order to, in turn, maximize the number of coaxial electrical connections of said plurality of coaxial electrical connectors to the hermetically sealed field replaceable pins and the circuit components of the RF hybrid assembly.

18. The combination as set forth in claim 17, wherein:

said plurality of coaxial electrical connectors mounted upon said single multi-pin RF field replaceable coaxial mounting flange structure comprises a pair of coaxial electrical connectors mounted upon a central region of said single multi-pin RF field replaceable coaxial mounting flange structure; and said fastener means comprises a pair of fasteners mounted upon opposite, laterally spaced end portions of said single multi-pin RF field replaceable coaxial mounting flange structure.

19. The combination as set forth in claim 18, wherein:

said pair of coaxial electrical connectors and said pair of fasteners are disposed within a linear array so as to minimize the height dimension and depth profile of said multi-pin RF field replaceable coaxial mounting flange system.

20. The combination as set forth in claim 17, wherein:

said plurality of coaxial electrical connectors mounted upon said single multi-pin RF field replaceable coaxial mounting flange structure comprises three coaxial electrical connectors mounted upon a central region of said single multi-pin RF field replaceable coaxial mounting flange structure; and said fastener means comprises a pair of fasteners mounted upon opposite, laterally spaced end portions of said single multi-pin RF field replaceable coaxial mounting flange structure.

21. The combination as set forth in claim 20, wherein:

said three coaxial electrical connectors and said pair of fasteners are disposed within a linear array so as to minimize the height dimension and depth profile of said multi-pin RF field replaceable coaxial mounting flange system.

22. The combination as set forth in claim 17, wherein:

said plurality of coaxial electrical connectors mounted upon said single multi-pin RF field replaceable coaxial mounting flange structure comprises four coaxial electrical connectors mounted upon a central region of said single multi-pin RF field replaceable coaxial mounting flange structure; and said fastener means comprises a pair of fasteners mounted upon opposite, laterally spaced end portions of said single multi-pin RF field replaceable coaxial mounting flange structure.

23. The combination as set forth in claim 22, wherein:

said four coaxial electrical connectors are divided into first and second pairs of coaxial electrical connectors laterally spaced from each other, and said fastener means comprises a third fastener interposed between said first and second pairs of coaxial electrical connectors.

24. The combination as set forth in claim 23, wherein:

said four coaxial electrical connectors and said three fasteners are disposed within a linear array so as to minimize the height dimension and depth profile of said multi-pin RF field replaceable coaxial mounting flange system.

* * * * *